United States Patent
Egan et al.

(10) Patent No.: US 6,353,315 B1
(45) Date of Patent: Mar. 5, 2002

(54) METHOD AND APPARATUS FOR USING THE DATA INTERFACE OF A DISK DRIVE TO IDENTIFY AND CHARACTERIZE DISK FLAWS

(75) Inventors: Curtis Egan, Thornton; Steve McCarthy, Platteville, both of CO (US); David Winters, Fremont, CA (US)

(73) Assignee: Maxtor Corporation, Longmont, CO (US)

( * ) Notice: Subject to any disclaimer, the term of this patent is extended or adjusted under 35 U.S.C. 154(b) by 0 days.

(21) Appl. No.: 09/384,939

(22) Filed: Aug. 27, 1999

(51) Int. Cl.$^7$ ................................................. G01R 33/12
(52) U.S. Cl. ........................ 324/212; 360/25; 360/31; 714/718
(58) Field of Search ................ 324/212, 210; 360/31, 28, 53; 714/719, 54, 718

(56) References Cited

U.S. PATENT DOCUMENTS

| | | |
|---|---|---|
| 4,881,136 A | 11/1989 | Shiraishi et al. ............... 360/25 |
| 5,050,169 A | 9/1991 | Monett ....................... 371/21.2 |
| 5,121,057 A | 6/1992 | Huber et al. ................. 324/212 |
| 5,247,254 A | 9/1993 | Huber et al. ................. 324/212 |
| 5,424,638 A | 6/1995 | Huber ......................... 324/212 |
| 5,588,011 A | 12/1996 | Riggle ......................... 371/43 |
| 5,661,760 A | 8/1997 | Patapoutian et al. ........ 375/341 |
| 5,822,139 A | * 10/1998 | Ayabe ......................... 360/31 |
| 5,838,510 A | 11/1998 | Inbar ........................... 360/46 |
| 6,005,727 A | * 12/1999 | Behrens et al. ............... 360/48 |
| 6,122,131 A | * 9/2000 | Jeppson ..................... 360/77.02 |

* cited by examiner

*Primary Examiner*—Jay Patidar
(74) *Attorney, Agent, or Firm*—David M. Sigmond

(57) ABSTRACT

A byte wide flaw scan interface is used to identify an characterize flaws in a disk medium. In one embodiment, the associated disk drive (100) includes head electronics (120) associated with a disk drive controller (122) via an NRZ interface (127). The NRZ interface (127) is operative for transmitting flaw information for a particular disk address via 8 predefined bit lines. The bit lines have separate definitions for user data sector addresses and servo wedge addresses. By using this byte wide interface, media flaws of various types can be identified and characterized based on a single pass of the transducer head over the disk surface thereby shortening testing times.

36 Claims, 4 Drawing Sheets

METHOD AND APPARATUS FOR USING THE DATA INTERFACE OF A DISK DRIVE TO IDENTIFY AND CHARACTERIZE DISK FLAWS

FIELD OF THE INVENTION

The present invention relates in general to detecting flaws on the disk surface of a magnetic disk storage medium, and, in particular, to a method and apparatus for using the data interface of a disk drive to efficiently identify and characterize disk flaws.

BACKGROUND OF THE INVENTION

A disk drive typically includes multiple disks that rotate on a spindle. Each disk normally has two surfaces for storing data in generally concentric data tracks. The data can be written onto the disk surfaces and read therefrom by transducer heads that are guided over the disk surfaces by an actuator arm. The actuator arm, in turn, is driven by a voice coil motor controlled by a control system to position the transducer heads relative to the desired data tracks. The disk surfaces, transducer heads, and related circuitry thus define a data interface of the disk drive.

An important part of testing and properly operating a disk drive is detecting disk flaws. Such flaws may be due to a variety of factors such as surface scratches, contaminants on the disk surface, and irregularities in the disk fabrication process, and can interfere with proper data storage and retrieval if not accounted for. For example, the flaws may cause data bits or blocks of data to drop in, drop out, or otherwise be improperly stored or retrieved. Accordingly, disk drives are normally tested to identify disk flaws. Depending on the nature of the flaw, appropriate remedial action may be taken such as by mapping the locations of data bits or data sectors where flaws are identified such that these disk areas may be avoided during operation of the disk drive.

A number of such flaw scanning processes have been proposed. Many of these processes involve writing an analog or digital signal onto the disk surface, reading back the signal and analyzing the read signal to identify flaws. Generally, however, these processes are time consuming, inaccurate, and/or provide little real time flaw characterization information regarding the types of flaws.

One flaw scanning process involves using the data interface to identify flaws by writing a pattern of bits into the user data sectors of a disk data track and then reading the data back from the same user data sectors. The read data can then be compared to the written data in order to identify flaws. The data sectors of the disk can thereby be qualified on a bit-by-bit basis. This flaw scanning information can be transferred between the head and the control chip using the so-called NRZ interface which is essentially an I/O data bus, between the read write channel and the controller. For example, a specified bit line of the NRZ interface can be set to a specified high or low value so as to indicate a flaw, This information can be used by the disk drive control system to develop a flaw map.

Although this flaw scan process is useful in identifying media flaws, it is limited in certain respects. For example, this process has been limited to identifying flaws in the data sectors of disks. Disks normally include servo data wedges which are interspersed between data sectors on a disk surface. The servo wedges include information for, among other things, guiding the heads over the data tracks and synchronizing the data channels to properly read or write data in adjacent data sectors. Flaws can occur in such servo wedges that may interfere with proper data storage and retrieval. Accordingly, it is desirable to identify flaws in the servo wedges as well as the data sectors. Moreover, the flaw scan process described above is limited to identifying media flaws. Consequently, in real time, a media flaw can generally be identified but not further characterized. Flaw characterization in the noted process also requires multiple passes over the disk area under analysis which slows the testing process and, in the context of flaw scanning in connection with the manufacturing process, this slows production rates.

SUMMARY OF THE INVENTION

The present invention is directed to a method and apparatus for using the data interface to efficiently and accurately identify and characterize flaws on a disk surface. The invention allows for flaw characterization in substantially real time, thereby reducing the time required for flaw testing. In addition, the invention provides an interface for transferring both flaw identification and flaw characterization information between the transducer heads and the controller for substantially complete and accurate flaw detection. The invention also allows for reading flaw scan information from servo wedges as well as user data sectors of the disk. Moreover, in accordance with the present invention, the flaw scan data can be read from the servo wedges and user data sectors in a single pass so as to further decrease testing time.

According to one aspect of the present invention, data read from a disk area in a single pass is used to both identify and characterize a disk flaw. The associated method includes the steps of: writing information to the disk area; reading information from the disk area on a single pass over the disk area; based on the read information, identifying a disk flaw and characterizing the disk flaw as to type; and communicating the flaw type to a controller of the disk drive. For example, the flaw may be characterized as being one of a thermal asperity related flaw, Viterbi related flaw, a voltage gain amplifier (VGA) related flaw, a phase-lock loop (PLL) related flaw, or other type of flaw as described in more detail below. This flaw information can be used for disk diagnostics such as in constructing a flaw map for use in operation of the disk drive.

According to another aspect of the present invention, data read from a disk area in a single pass is used to identify and characterize flaws of different types. The corresponding method involves: writing information onto the disk area; reading information from the disk area on a single pass; based on the read information, identifying a first disk flaw of a first type and identifying a second disk flaw of a second type; and communicating flaw information regarding the first flaw type and the second flaw type to a controller of the disk drive. By virtue of this process, flaws of different types can be identified and characterized based on a single pass over a disk surface area.

According to another aspect of the present invention, data read from a disk area in a single pass is used to identify and characterize flaws of different types. The corresponding method involves: writing information onto the disk area; reading information from the disk area on a single pass; based on the read information, identifying a first disk flaw of a first type and identifying a second disk flaw of a second type; and communicating flaw information regarding the first flaw type and the second flaw type to a controller of the disk drive. By virtue of this process, flaws of different types can be identified and characterized based on a single pass over a disk surface area.

According to a still further aspect of the present invention, a process is provided for using the disk drive data interface between the transducer heads and the disk drive controller to transmit flaw scan information sufficient to identify and characterize a disk flaw. The process involves defining a multiple bit data interface assigning a value to at least one bit of the data interface so as to identify a flaw type, and transmitting the value between a read channel and a controller of the disk drive. Preferably, the data interface is populated with at least one bit for providing information regarding a first flaw type and at least another bit for providing information regarding a second flaw type. In one embodiment, a byte wide interface is defined including eight defined bits for providing eight different types of flaw information. Separate bit definitions may be provided for servo wedge addresses and user data sector addresses. In this regard, when the data is presented, the associated procession determines whether it is for a user data sector or a servo wedge, e.g., based on the associated disk address/location.

According to a still further aspect of the present invention, a process is provided for using the disk drive data interface between the transducer heads and the disk drive controller to transmit flaw scan information sufficient to identify and characterize a disk flaw. The process involves defining a multiple bit data interface assigning a value to at least one bit of the data interface so as to identify a flaw type, and transmitting the value between a read channel and a controller of the disk drive. Preferably, the data interface is populated with at least one bit for providing information regarding a first flaw type and at least another bit for providing information regarding a second flaw type. In one embodiment, a byte wide interface is defined including eight defined bits for providing eight different types of flaw information. Separate bit definitions may be provided for servo wedge addresses and user data sector addresses. In his regard, when the data is presented, the associated processor determines whether it is for a user data sector or a servo wedge, e.g., based on the associated disk address/location.

BRIEF DESCRIPTION OF THE DRAWINGS

For a more complete understanding of the present invention and further advantages thereof, reference is now made to the following detailed description taken in conjunction with the drawings in which.

DETAILED DESCRIPTION OF THE INVENTION

In the following description, the invention is set forth in the context of flaw scanning the user data sectors and servo wedges of a disk surface, and for providing information for characterizing specific types of disk flaws by way of particular data bus interfaces. Upon consideration of the following description, it will be readily apparent that the specific structures, processes and data interfaces described below may be varied without departing from the spirit and scope of the present invention. Moreover, it will be appreciated that other types of flaws and other flaw characterizations may be supported in accordance with the present invention. Accordingly, the following description should be understood as exemplifying, not limiting, the present invention.

Figure 1:
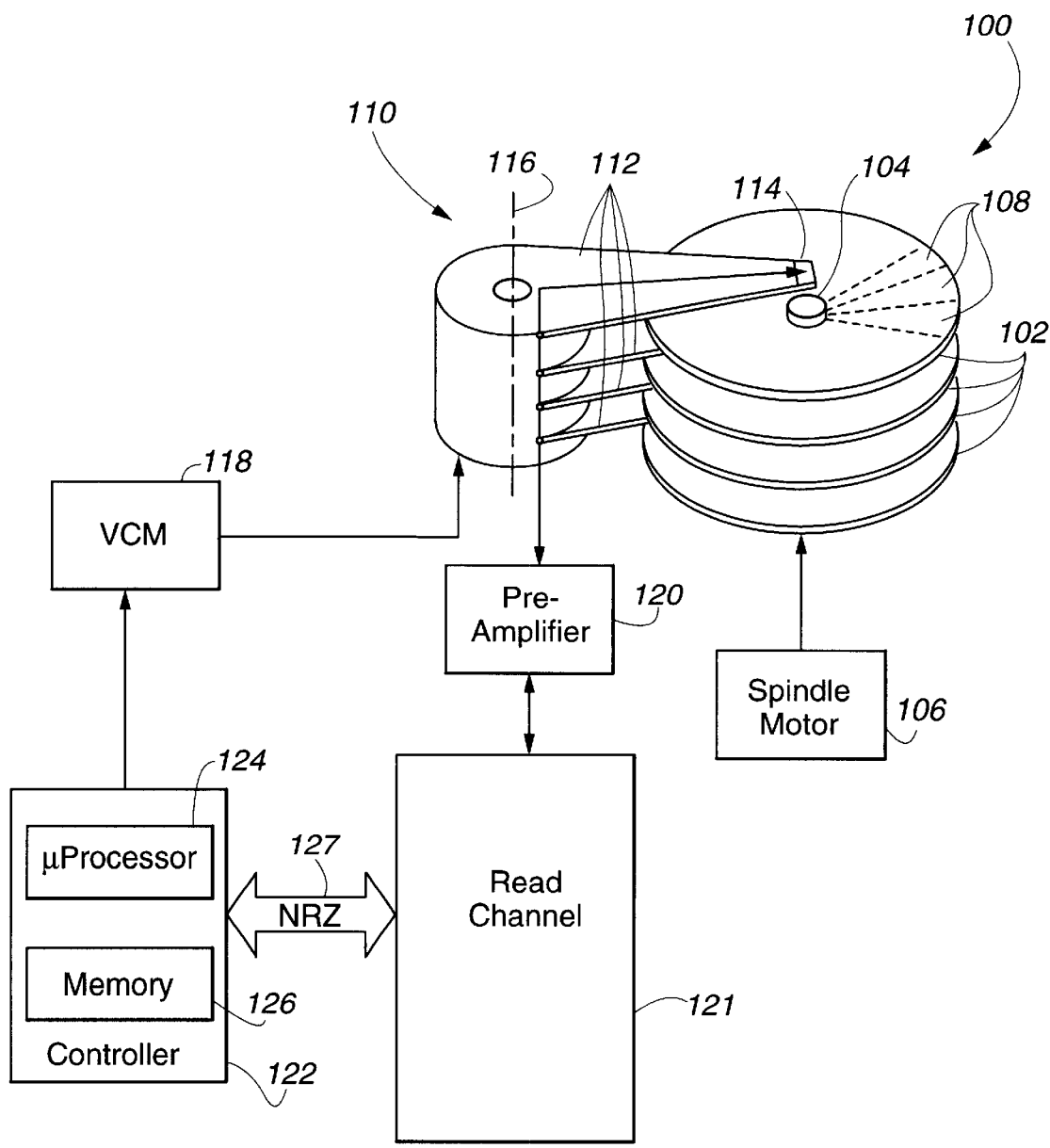
FIG 1 is a schematic diagram of a disk drive unit in accordance with the present invention.

FIG. 1 illustrates a disk drive 100 in accordance with the present invention. As will be described in more detail below, the data interface of the disk drive 100 is used in a novel flaw scan process. The disk drive 100 includes a stack of disks 102 mounted on a rotatable spindle 104. The spindle is rotationally driven by a spindle motor 106. The stack typically includes four or more disks 102 although any number of disks may be accommodated by the present invention. Each of the disks 102 is divided into a number of sectors 108 as will be described in more detail below. The disks 102 are typically clamped to the spindle 104 in a generally concentric fashion.

The disk drive 100 also includes an actuator arm assembly 110 for use in reading data from or writing data to the disks 102. The illustrated assembly 110 includes a number of actuator arms 112 each carrying a slider 114 (only one shown). The slider 114 in turn carries a single head for reading and writing or separate read and write heads for respectively reading from and writing to a disk 102. The heads can be linearly or non-linearly moved relative to the disk surface. In the illustrated embodiment the actuator arm 112 is pivotally mounted relative to an actuator axis 116 such that the slider 114 moves arcuately over the disk surface. In this regard, the actuator arms 112 are driven by a voice coil motor (VCM) 118. The VCM 118 can be used for track searching ("searching") and track following ("tracking"). Searching generally involves finding a particular track and sector where a data transfer operation is to be performed. Tracking involves following a data track.

Figure 2:
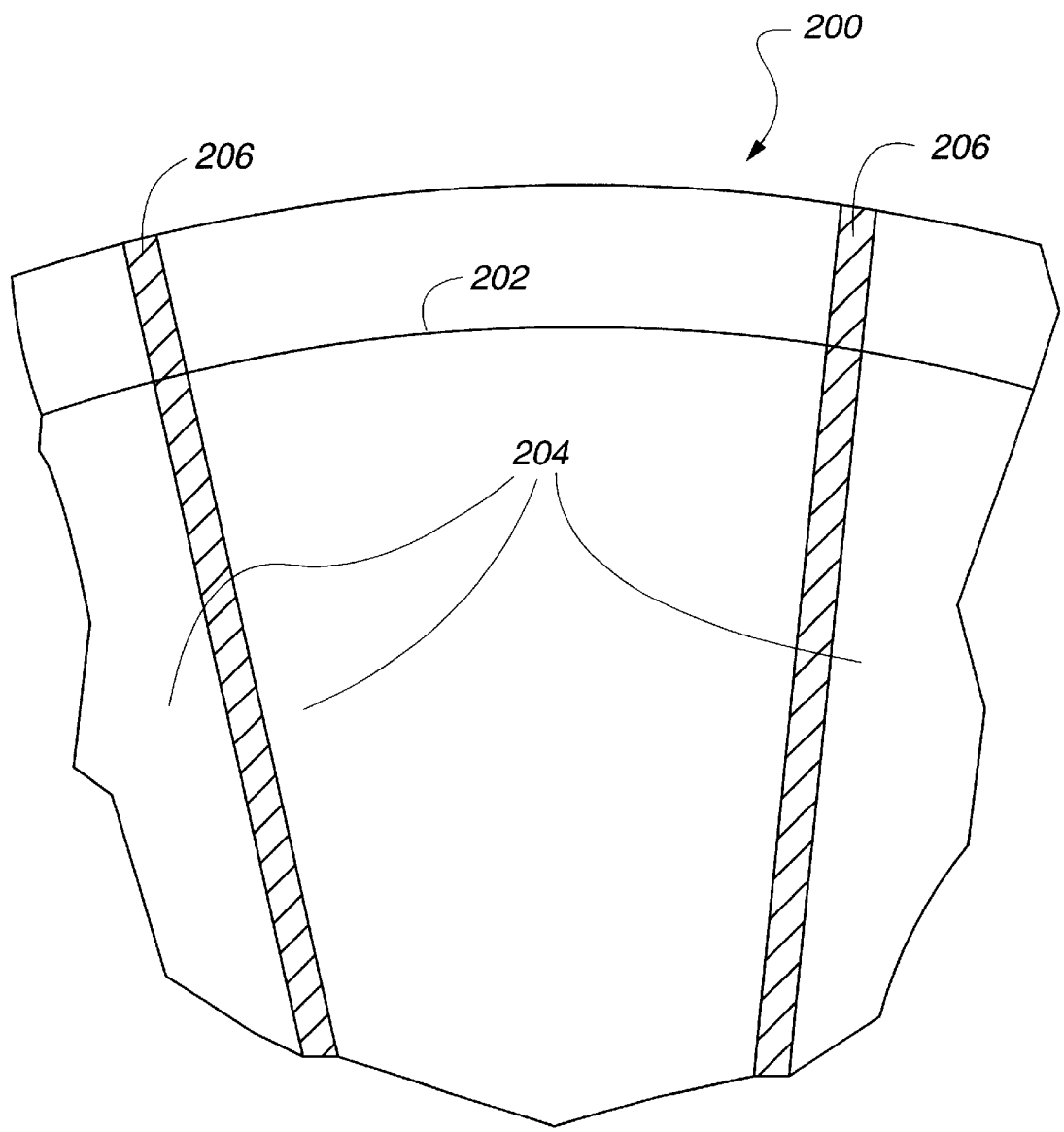
FIG 2 is an illustration of a disk surface showing user data sectors and servo wedges (not to scale), each of which may be scanned for flaws in accordance with the present invention.

FIG. 2 shows a portion of a disk surface 200. Data is stored on the disk surface 200 in generally concentric tracks 202. More specifically, user data can be written to and read from the track 202 in a number of user data sectors 204. In order to facilitate proper guidance of the heads over the track 202, i.e., for searching and tracking, servo data is interspersed with the user data sectors 204 in servo wedges 206. Among other things, the data stored in the servo wedges 206 may include track and sector identification information, data bursts for use in closed loop feedback controlled positioning of the head(s) relative to the data track, and synchronization information to facilitate proper reading or writing for the following user data sector.

The present invention relates to detecting flaws in the disk surface 200. Such flaws can interfere with proper data storage on and retrieval from the disk surface by causing bits or blocks of data to drop in, drop out or otherwise be improperly stored and retrieved. More specifically, data is stored on the disk in a thin magnetic medium on the disk surface. A flaw may result due to a scratch on the disk surface, contaminants on the surface or other media imperfections. Such flaws may occur in the user data sectors 204 or servo wedges 206, and such flaws can result in improper retrieval if not accounted for.

Referring again to FIG. 1, such flaws are detected in accordance with the present invention by using the data interface of the disk drive 100 to write data onto a disk 102 and then read back the data. By analyzing the data read back after the write onto the disk 102 during the flaw scanning process, various types of flaws can be identified and characterized as to type. This information can then be used to avoid use of flawed areas of the disk, i.e., by "turning off" flawed data sectors, or to otherwise address such flaws. In accordance with the present invention flaws can be detected and characterized in the data sectors and servo wedges in substantially real time, i.e., in a single pass over the disk surface. Furthermore, this flaw identification and characterization information can be reported to the control system of the disk drive via a unique use of the data interface for providing such characterization information to the control system, e.g., in a defined byte wide interface for transmitting flaw data for each user data sector or servo wedge address.

More specifically, the disk drive 100 includes a pre-amplifier 120 and read channel 121. The pre-amplifier receives and amplifies signals from the head and transmits the processed signals to the read channel 121. The read channel 121 performs a number of operations related to the flaw scan process. In this regard, the read channel 121 or controller 122 is operative for writing a pattern of data onto the disk for purposes of the flaw scan. This data is read back from the same disk area, e.g., sectors or tracks, by the read channel 121.

The data read from the disks is analyzed by the read channel 121 to identify any flaws. For example, and as will be better understood upon consideration of the description below, the data written onto the disk may be read back and analyzed by the read channel 121 to identify data storage and recovery errors. In addition, the read signal may be analyzed to identify and characterize a variety of other flaws, for example, thermal asperity related flaws, Viterbi related flaws, VGA related flaws, PLL related flaws, etc. Accordingly, the illustrated read channel 121 may include a number of flaw detection modules including various conventional flaw detection modules.

The resulting flaw information is then processed for transmission across the NRZ interface 127 to the disk drive controller 122. Conventionally, certain flaw scan processes have been limited to identifying a user data sector address as either containing or not containing a media flaw based on a single pass over the corresponding disk area and related flaw analysis. In accordance with the present invention, multiple flaw analyses are performed by the read channel 121 for a given user data sector or servo wedge disk address, e.g., in parallel, based on a single pass over the corresponding disk surface area so as to test for various types of flaws.

The results of these analyses allow for substantially real time flaw identification and characterization. The read channel 121 processes the results of these analyses to convey the flaw identification and characterization data for a particular address over selected data lines. In one embodiment, as described below, the read channel 121 transmits a byte of data for a particular address to indicate flaw types.

This information is transmitted via the NRZ interface 127 to the disk drive controller 122. The controller 122 includes a microprocessor 124 and memory 126. The microprocessor 124 is operative for receiving the flaw scan information and decoding the information to extract the information for identifying and characterizing the flaws for particular addresses. This information can then be stored in memory 126, for use in operating the disk drive 100. For example, depending on the nature of the flaw, the controller 122 may operate the disk drive 100 to pad around a flaw location, or may otherwise disable particular disk addresses or sectors that are flawed, thus avoiding operating errors.

Figure 3:
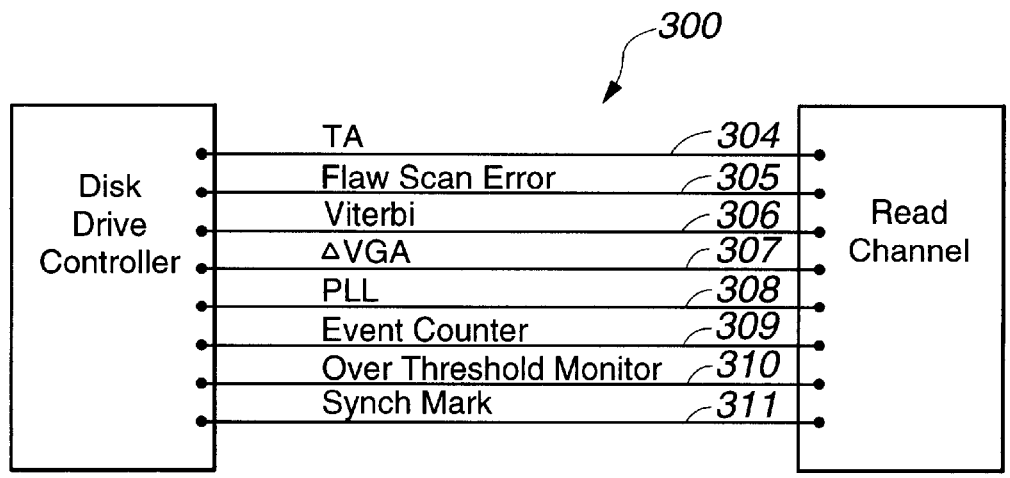
FIG. 3 illustrates a byte wide interface for a user data sector address in accordance with the present invention.
Figure 4:
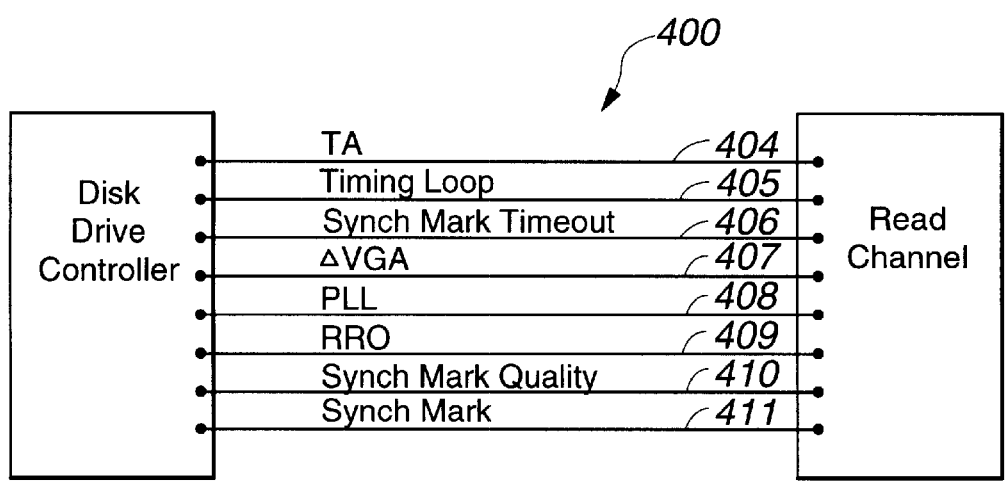
FIG. 4 illustrates a byte wide data interface for a servo wedge address in accordance with the present invention.

FIGS. 3 and 4 illustrate particular data fields for transmitting flaw identification and characterization information for a particular address across the NRZ interface. In particular, FIG. 3 illustrates a byte wide interface for transmitting flaw information for a user data sector address and FIG. 4 shows a byte wide interface for transmitting flaw information for a servo wedge address. It will be understood that a single interface supports both the user data sector and servo wedge interface definitions. In this regard, the information transmitted across the interface is interpreted by the controller which knows whether a given address is a user data sector or servo wedge address.

Referring first to FIG. 3, the illustrated flaw information interface 300 includes eight data bits 304–311. Information for identifying and describing the presented data may be separately obtained by the disk drive controller including, for example, the disk address with which the presented data is associated, the type of address (user data sector or servo wedge), the flaw scan mode or packet length (e.g., byte wide flaw scan mode or bit mode) and any other useful information for identifying or describing the presented data.

The interface includes a number of predefined flaw scan fields for characterizing flaws. It will be appreciated that various different types of flaws may be analyzed and reported via interface 300, and the flaw information may be reported in a variety of formats or field lengths. In the illustrated embodiment, the flaw information for a user data sector address is reported in eight, one-bit, predefined data fields as follows:

Data Bit 0. Bit 0 indicates the absence or presence of a thermal asperity (TA) event. A TA event occurs when the head hits contaminants or other irregularities oil the disk surface, causing the head to heat up. Because the head is a resistive device that is temperature sensitive, a code violation or baseline shift of the data may occur indicating potentially corrupt data. For each of the data bits, an error condition can be indicated by setting the corresponding line to its high value or "1". The lines can be set to low or "0" when no error exists. When a TA error is indicated for a user data sector address, the controller causes that address to be padded around so that the address is not used during disk drive operation.

Data bit 1. Data bit 1 is dedicated to identifying flaw scan errors. Such errors may be identified by, for example, writing a constant frequency pattern to the disk and analyzing the read signal for drop outs or a series of dropouts (the threshold number of dropouts to indicate a flaw being programmable). In this regard, the last 8 bits over the associated NRZ line may be AND/NAND gated (depending on whether the error is defined as "0" or "1") to identify an error. If an error is detected, the associated bit address is toggled for a byte clock time or a series of byte clock times, whichever is appropriate.

Data Bit 2. Data bit 2 is dedicated to identifying Viterbi detector identified flaws. Various types of Viterbi detectors have previously been developed. In accordance with the present invention, such a Viterbi detector is operated in parallel with the other flaw detection processes identified herein so as to provide substantially real time flaw scan data. This can be accomplished by AND/NAND gating the last eight samples from the Viterbi detector and correspondingly setting the associated NRZ line, similar to data bit 1.

Data Bit 3. This bit is used to identify VGA related flaws. Such flaws can be identified based on changes in VGA values. Accordingly, the flaw analyzer compares each VGA value to the preceding VGA value and defines errors based on a comparison to a programmable or predefined change threshold, e.g., ΔVGA>2, 3, 4 or 6 db.

Data Bit 4. This bit identifies PLL related flaws. Such flaws can be defined by PLL values in excess of a predefined acceptable value.

Data Bit 5. This bit identifies flaws indicated by a number of identified flaw related events. Certain events can be handled within the error correction capability of the disk drive provided there are not too many such events. A count is defined as an event that is greater than a predefined high pass filter length (e.g., 0, 2, 4 or 6 NRZ bits programmable) and less than the low pass filter length (0–30 NRZ bits programmable). Typically this value is one less than the value programmed for bit 1. If the event count exceeds a predetermined threshold of counts then data bit 5 is set to high for a predetermined interval (e.g., 5 byte clocks) and then the counter is reset in the data sector. The event count can also be accumulated as a rate or integrated sum of events over time. This integrated sum would accumulate and drop off events based on a time constant related to the byte clock of the read channel. In the user data sector mode, this bit using rate defection has the ability to count around sector portions split by a servo wedge.

Data Bit 6. This data bit provides an over threshold monitor. In particular, this bit is triggered in response to detection of a high gain in the VGA. If a sample level is above a threshold value then an error condition is defined subject to filtering. That is, a filter may be applied to drop ins the same as drop outs are defined in data bit 1 (also programmable), thus suppressing false detections.

Data Bit 7. In the illustrated implementation, Bit 7 is not used for flaw identification or characterization but, rather, is used to define a handshake protocol between the read channel and the controller. In this regard, Bit 7 is defined as low or "zero" except when a synchronization mark is forced onto the NRZ line indicating that a data transfer is going to start.

FIG. 4 shows a byte wide packet of flaw information for a servo wedge address. In the illustrated embodiment, the flaw information for a servo wedge address is reported in 8, 1 bit predefined data fields as follows:

Data Bit 1. Bit 1 is used to indicate that a TA flaw was detected during the previous servo wedge. To indicate a flaw, a corresponding NRZ line is set to 1.

Data Bit 1. This bit is to indicate that a timing loop problem was detected in the previous servo wedge.

Data Bit 2. This bit indicates whether a synchronization mark was detected for gray code with good quality in the previous servo wedge.

Data Bit 3. Data bit 3 is used to identify changes in the VGA from the previous value that are outside of a predefined threshold value. The threshold value for change in VGA may be programmed, for example, to be 2, 3, 4 or 6 db.

Data Bit 4. This bit indicates that the PLL value was over or under predefined threshold values in the previous servo wedge.

Data Bit 5. Data bit 5 is used to indicate an error related to the repeatable runout (RRO), or position error correction term the previous servo wedge. That is, a position error correction term may be written into a servo wedge to account for RRO. Data bit 5 indicates flaws relative to such terms.

Data Bit 6. Data bit 6 indicates that the quality of the synchronization mark in the previous servo wedge was either low or acceptable, The associated quality threshold may be programmable.

Data Bit 7. This bit is defined as low unless used to force synchronization mark onto the NRZ data bus for data process synchronization.

FIG. 4 shows a byte wide packet of flaw information for a servo wedge address. In the illustrated embodiment, the flaw information for a servo wedge address is reported in 8, 1 bit predefined data fields as follows:

Data Bit 0. Bit 0 is used to indicate that a TA flaw was detected during the previous servo wedge. To indicate a flaw, a corresponding NRZ line is set to 1.

Data Bit 1. This bit is to indicate that a timing loop problem was detected in the previous servo wedge.

Data Bit 2. This bit indicates whether a synchronization mark was detected for gray code with good quality in the previous servo wedge.

Data Bit 3. Data bit 3 is used to identify changes in the VGA from the previous value that are outside of a predefined threshold value. The threshold value for change in VGA may be programmed, for example, to be 2, 3, 4 or 6 db.

Data Bit 4. This bit indicates that the PLL value was over or under predefined threshold values in the previous servo wedge, Data Bit 5. Data bit 5 is used to indicate an error related to the repeatable runout (RRO), or position error correction term the previous servo wedge. That is, a position error correction term may be written into a servo wedge to account for RRO. Data bit 5 indicates flaws relative to such terms.

Data Bit 6. Data bit 6 indicates that the quality of the synchronization mark in the previous servo wedge was either low or acceptable. The associated quality threshold may be programmable.

Data Bit 7. This bit is defined as low unless used to force synchronization mark onto the NRZ data bus for data process synchronization.

Figure 5:
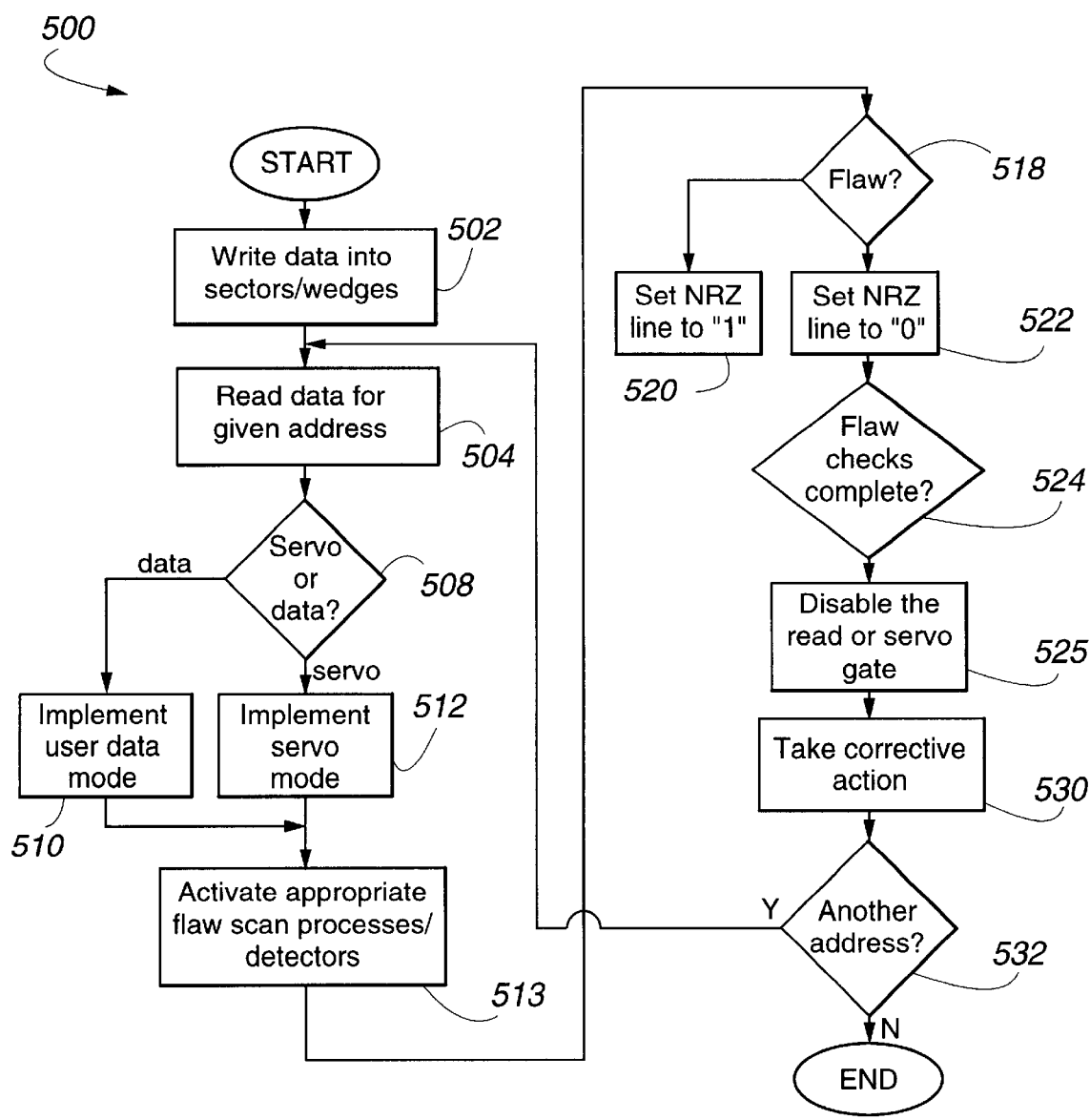
FIG. 5 is a flow chart illustrating a process for flaw scanning in a disk drive in accordance with the present invention.

FIG. 5 is a flowchart that illustrates the overall operation of the flaw identification and characterization system described above. The process 500 is initiated by writing (502) data into the user data sectors and portions of the servo wedges, if applicable, of a disk under analysis. The data is then read (504) back from a particular address or location and processed depending (508) on whether the address is a servo wedge or user data sector address. In this regard, the controller is a state machine that determines whether a location is a servo wedge or data sector.

If the head is over a data sector location, then the data flaw process is implemented (510). Conversely, when the head is over the servo wedge location, the servo mode is implemented (512) such that the disk drive controller inherently knows and can properly interpret the corresponding transmitted data over the NRZ bus.

Also, based on the location of the head the read channel will activate with the help of the controller appropriate flaw scan detectors (513). If the read channel circuitry indicates a flaw (518), then the associated NRZ bit line is set to "1" (520). Otherwise, the bit line is set to "0" (522). As indicated by decision box 524, this process is repeated until the read or servo gate is disabled by the controller. Although this process for performing the various flaw checks for a given location is illustrated by way of a repeating loop in FIG. 5 for purposes of convenience, it will be appreciated that the various functions may be conducted in parallel.

As the flaw checks are occurring, the results are transmitted to the disk drive control system via the NRZ bus. The control system is then operated to latch in the NRZ bits to identify and characterize potential flaws based on the operating mode (data or servo). Based on this information, corrective action may be taken (530) based on the flaw characterization. Thus, particular locations my be reassigned, padded or otherwise dealt with in order to reduce disk drive errors in operation due to disk flaws.

While various embodiments of the present invention have been described in detail, it is apparent that further modifications and adaptations of the invention will occur to those skilled in the art. However, it is to be expressly understood that such modifications and adaptations are within the spirit and scope of the present invention.

What is claimed is:

1. A method for use in scanning for flaws in a disk of a disk drive, comprising the steps of:

writing first information onto said disk;

reading second information from said disk on a single pass over a surface area of said disk using a read channel;

based on said second information read from said surface area of said disk, identifying a first disk flaw and a first type of said first disk flaw; and communicating first flaw type information regarding said type of said first disk flaw from said read channel to a controller of said disk drive;

wherein said flaw type information can be used in operating said disk drive.

2. A method as set forth in claim 1, wherein said step of writing comprises writing data into a user data sector of said disk.

3. A method as set forth in claim 1, wherein said step of writing comprises writing into a user data sector and a servo wedge said disk.

4. A method as set forth in claim 1, wherein said step of reading comprises reading data from a user data sector of said disk.

5. A method as set forth in claim 1, wherein said step of reading comprises reading data from a user data sector and a servo wedge of said disk.

6. A method as set forth in claim 1, wherein said surface area comprises a user data sector and said type of said first disk flaw comprises one of a drop-out related flaw and a drop-in related flaw.

7. A method as set forth in claim 1, wherein said surface area comprises a user data sector and said type of said first disk flaw comprises one of a thermal asperity related flaw, a voltage gain amplifier related flaw and a phase lock loop related flaw.

8. A method as set forth in claim 1, wherein said surface area comprises a user data sector and said type of said first disk flaw comprises a Viterbi related flaw.

9. A method as set forth in claim 1, wherein said step of identifying comprises defining an event that can be addressed within an error correction capability of said disk drive and monitoring occurrences of said event, wherein said first disk flaw is identified based on an event threshold that can be expressed in terms of a number of events within one of a defined disk area and a defined disk scanning time.

10. A method as set forth in claim 1, wherein said surface area comprises a servo wedge and said type of said first disk flaw comprises one of a thermal asperity related flaw, a voltage gain amplifier related flaw, a timing loop related flaw, and a phase lock loop related flaw.

11. A method as set forth in claim 1, wherein said surface area comprises a servo wedge and said type of said first disk flaw comprises a flaw related to the quality of a gray code.

12. A method as set forth in claim 1, wherein said surface area comprises a servo wedge and said type of said first disk flaw is related to a position error signal for correcting a repeatable runout error.

13. A method as set forth in claim 1, wherein said surface area comprises a servo wedge and said type of said first disk flaw is related to a quality of a synchronization mark.

14. A method as set forth in claim 1, wherein said step of communicating comprises associating a plurality of bit addresses with a plurality of flaw types and assigning at least one of said bit addresses a value so as to indicate said type of said first disk flaw.

15. A method as set forth in claim 1, wherein said step of communicating comprises defining at least a byte wide interface including bits for identifying flaws of various types and assigning values to said bits so as to indicate said type of said first disk flaw.

16. A method as set forth in claim 1, further comprising the steps of:

based on said second information read from said surface area of said disk on said single pass over said surface area, identifying a second disk flaw of a second type different from said first type; and communicating second flaw type information regarding said second type of said second disk flaw from said read channel to said controller of said disk drive.

17. A method as set forth in claim 16, wherein said first disk flaw is identified relative to a user data sector of said disk and said second disk flaw is identified relative to a servo wedge of said disk.

18. A method for use in scanning for flaws in a disk of a disk drive, comprising the steps of:

writing first information onto said disk;

reading second information from said disk on a single pass over said surface area of said disk;

based on said second information read from said surface area of said disk, identifying a first disk flaw of a first type and a second disk flaw of a second type different from said first type; and communicating flaw information regarding said first said disk flaw type and said second disk flaw type to a controller of said disk drive;

wherein said flaw information can be used in operating said disk drive.

19. A method as set forth in claim 18, wherein one of said first disk flaw and said second disk flaw is a Viterbi related flaw.

20. A method as set forth in claim 18, wherein said step of identifying comprises identifying one of said first disk flaw and said second disk flaw by defining an event that can be addressed within an error correction capability of said disk drive and monitoring occurrences of said event, wherein one of said first disk flaw and said second disk flaw is identified based on an event threshold that can be expressed in terms of a number of events within one of a defined disk area and a defined disk scanning time.

21. A method as set forth in claim 18, wherein said step of communicating comprises associating a first bit address with said first type, associating a second bit address with said second type, and assigning said first bit address and said second bit address values so as to indicate said first disk flaw and said second disk flaw.

22. A method as set forth in claim 18, wherein said step of communicating comprises defining at least a byte wide interface including bits for identifying flaws of various types and assigning values to said bits so as to indicate said first type and said second type.

23. A method as set forth in claim 18, wherein said first disk flaw is identified relative to a user data sector of said disk and said second disk flaw is identified relative to a servo wedge of said disk.

24. A method for use in scanning for flaw in a disk of a disk drive, said disk including servo wedges including servo tracking data and data sectors for storing user data, said method comprising the steps of:

first using a first disk drive head to write first information into a first servo wedge;

second using a second disk drive head to read second information from said first servo wedge; and based on said second information read from said first servo wedge, identifying a disk flaw in said first servo wedge.

25. A method as set forth in claim 24, wherein said identified disk flaw in said first servo wedge comprises one of a thermal asperity related flaw, a voltage gain amplifier related flaw, a timing loop related flaw, and a phase lock loop related flaw.

26. A method as set forth in claim 24, wherein said identified disk flaw in said first servo wedge comprises a flaw related to a quality of a gray code.

27. A method as set forth in claim 24, wherein said identified disk flaw in said first servo wedge comprises a flaw related to a position error signal for correcting a repeatable runout error.

28. A method as set forth in claim 24, wherein said identified disk flaw in said first servo wedge comprises a flaw related to a quality of a synchronization mark.

29. A method as set forth in claim 24, further comprising the step of communicating flaw information regarding a type of said disk flaw from a read channel to a controller of said disk drive.

30. A method for use in scanning for flaws in a disk of a disk drive, comprising the steps of:

defining a multiple bit data interface;

assigning a value to at least one bit of said data interface so as to convey information regarding a first type of flaw identified in a flaw scan; and transmitting said value including said information regarding said first type of flaw between a read channel and a disk drive controller of said disk drive.

31. A method as set forth in claim 30, wherein said step of defining comprises associating a first bit of said interface with a first type of flaw and associating a second bit of said interface with a second type of flaw different than said first type.

32. A method as set forth in claim 30, wherein said multiple bit data interface comprises at least a byte wide interface including bits for identifying flaws of various types.

33. A method as set forth in claim 30, wherein said step of defining comprises providing a first definition for a user data sector of said disk and a second definition for a servo wedge of said disk.

34. A disk drive, comprising:

a disk;

an actuator arm carrying at least one transducer;

channel means for writing information onto a surface area of the disk, reading information from the surface area of the disk, identifying a disk flaw, characterizing the flaw as to type, and establishing flaw characterization information related to a defined disk location; and a data bus, extending between the read channel means and a disk controller, for transmission of the flaw characterization information.

35. A disk drive is set forth in claim 34, wherein said data bus comprises a plurality of bit lines for transmitting said flaw characterization information.

36. A disk drive is set forth in claim 34, wherein said data bus comprises an at least byte wide data interface including bit lines for identifying flaws of various types.

* * * * *